United States Patent [19]
Beville et al.

[11] 3,843,873
[45] Oct. 22, 1974

[54] COUNTER HAVING SELECTIVE DIRECTION AND VARIABLE RATE CONTROL

[75] Inventors: Robert Earl Beville; Bruce Edward Hofer; William H. Peek, all of Beaverton, Oreg.

[73] Assignee: Tektronix, Inc., Beaverton, Oreg.

[22] Filed: Sept. 19, 1972

[21] Appl. No.: 290,312

[52] U.S. Cl........ 235/92 EV, 235/92 MP, 235/92 R
[51] Int. Cl........................................... G06m 3/14
[58] Field of Search...... 235/92 EV, 92 MP, 92 EA; 340/347 AD

[56] References Cited

UNITED STATES PATENTS

| | | | |
|---|---|---|---|
| 2,827,232 | 3/1958 | Hancock | 340/347 AD |
| 3,007,149 | 10/1961 | Brown | 340/347 AD |
| 3,495,073 | 2/1970 | James | 340/347 AD |
| 3,729,129 | 4/1973 | Fletcher et al. | 235/92 EA |

*Primary Examiner*—Gareth D. Shaw
*Assistant Examiner*—Joseph M. Thesz, Jr.
*Attorney, Agent, or Firm*—Adrian J. LaRue

[57] ABSTRACT

A control means is connected to a reversible programmable counter in order to select the direction of the count and to vary the repetition rate at which the counter can be incremented or decremented. The counter, which provides a visible readout of the counter information, can be increased or decreased towards the value desired at a high rate when the number has to be changed by a large amount or at a low rate if the change of the number is small.

15 Claims, 2 Drawing Figures

COUNTER HAVING SELECTIVE DIRECTION AND VARIABLE RATE CONTROL

BACKGROUND OF THE INVENTION

In electronic circuitry, it is essential that after an event occurs, circuitry is to be activated at a precise time interval after the occurrence of such event to ensure proper operation of such circuitry. An example of this is the operation of a delayed sweep circuit of the horizontal sweep circuit of an oscilloscope whereby the horizontal sweep of the cathode ray beam is delayed for a period of time after an input waveform has been received and typically the delayed sweep is operated at some point along the linear ramp of the sawtooth waveform generated by the horizontal sweep circuit. However, due to the linear ramp not being truely repetitive since discontinuities occur in the ramp which are commonly referred to as jitter, the same point that has been selected to operate the delayed sweep will vary in correspondence with the amount of jitter that is present thereby resulting in the delayed sweep operating at imprecise time intervals instead of at precise time intervals.

The present invention overcomes the imprecise operation of the delayed sweep of the horizontal deflection of a cathode ray beam across the phosphor target of a cathode ray tube by selecting a precise time interval after an input waveform has been received to operate the horizontal deflection circuitry and this is accomplished by setting electronic counter circuitry to trigger the operation of the horizontal deflection circuitry at any desired time after the receipt of the input waveform.

Of course, instead of selecting a desired time to operate the electronic counter circuitry, it can be operated after a number of events have occurred such as, for example, selecting a certain scanning line of a television scanning system after the scanning has been initiated in order to analyze this particular scanning line. The variable direction and rate control counter of the present invention can be used in other applications requiring precise operation in accordance with the selected time or events at which the counter means has been set.

An object of the present invention is to provide a selective direction and variable rate control counter means for precisely operating electronic circuitry at selected time intervals.

Another object of the present invention is the provision of a selective direction and variable rate control counter means for precisely operating electronic circuitry at the occurrence of events.

A further object of the present invention is to provide a selective direction and variable rate control counter means that can select displayed information at a rapid rate.

An additional object of the present invention is the provision of a selective direction and variable rate control counter means that can select displayed information at a slow rate.

A still further object of the present invention is to provide a single control means for operating the selective direction and variable rate control counter means in either direction and at a desired rate.

Still another object of the present invention is the provision of automatic null positioning of the control means once selected information has been displayed.

A still additional object of the present invention is that by using a single control means space is conserved on a front panel of the instrument.

BRIEF DESCRIPTION OF DRAWINGS

Other objects and advantages of the present invention will be apparent from the following detailed description of a preferred embodiment thereof and from the attached drawings of which.

DETAILED DESCRIPTION OF PREFERRED EMBODIMENT

Figure 1:
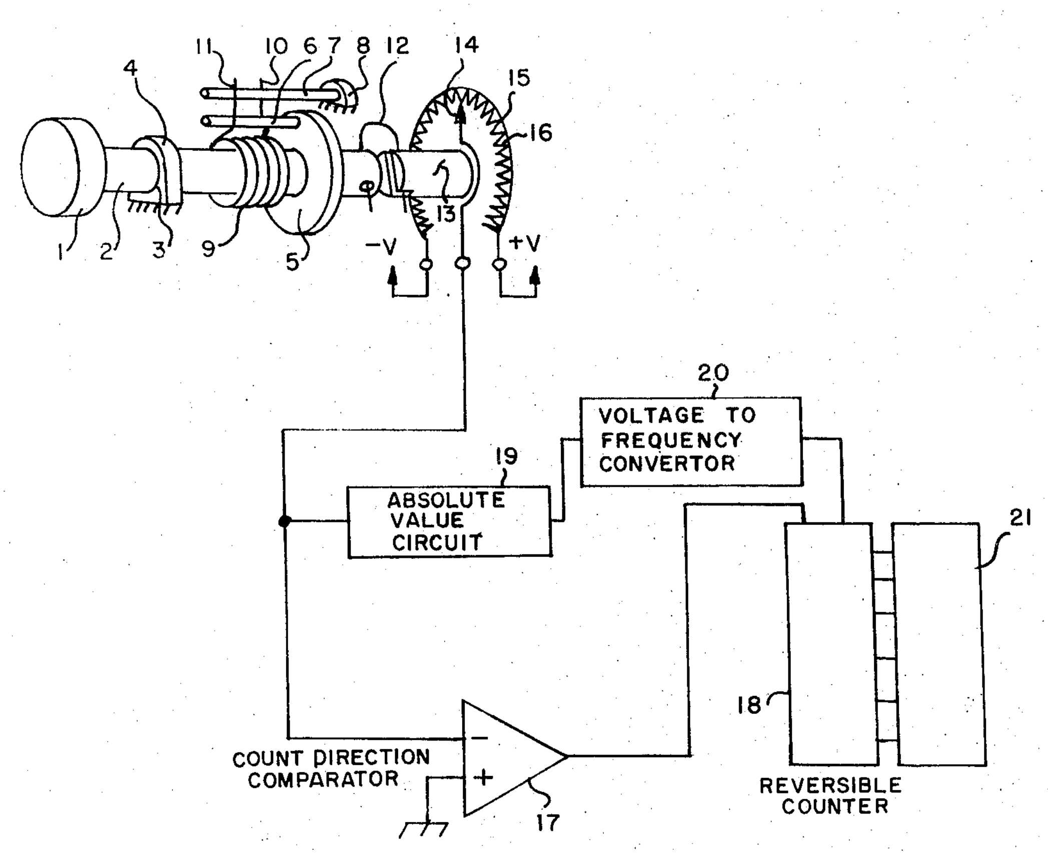
FIG. 1 is a block diagram of the variable direction and rate control counter means.

A control knob 1 is mounted on a shaft 2 extending through an opening 3 in a front panel 4 of an instrument in which the invention is to be used. A disc 5 is provided on shaft 2 for movement therewith and it has a pin 6 extending outwardly therefrom parallel with shaft 2. Another pin 7 has one end secured to a part 8 of the instrument and it is disposed above and parallel with pin 6 and shaft 2 so that shaft 2 and pins 6 and 7 are in alignment. A spring 9 has its coils extending around shaft 2 with ends 10 and 11 disposed for engagement with pins 6 and 7.

If shaft 2 is rotated clockwise, end 10 of spring 9 engages pin 7 while end 11 is engaged by pin 6 causing spring 9 to be placed under tension which increases as a function of the rotation. When the tension is decreased, the shaft will be returned to its original position. The same action occurs if shaft 2 is rotated counter-clockwise direction. One end of resistive winding 16 is connected to a positive voltage while its other end is connected to a negative voltage.

Wiper arm 14 is connected to a voltage polarity comparator circuit 17 whose output is connected to a reversible counter 18 in order to operate same in a forward or reverse direction depending on the polarity of the output. Wiper arm 14 is also connected to absolute value circuit 19 which determines the absolute value of the voltage sensed by wiper arm 14. The output of absolute value circuit 19 is connected to a voltage-to-frequency convertor circuit 20 whose output frequency is a function of the input voltage and is used to increment or decrement the counter 18 at a rate dependent on this frequency. The direction of the count of counter 18 is dependent on the output from polarity comparator circuit 17. The outputs from counter 18 are then fed into utilization circuit 21 which includes display means such as nixie tubes, light-emitting diodes or the like to display the digital information generated by counter 18 and to enable an operator to change the count in either direction and at a desired rate in accordance with the direction and rate of movement of knob 1. One example of such an utilization circuit is the one disclosed in U.S. Pat. application Ser. No. 845,393, filed July 28, 1969 now U.S. Pat. No. 3,651,510, under the name of Barrie Gilbert and assigned to the Assignee of the present invention, which discloses a character Generator Apparatus wherein an integrated circuit structure is utilized to display alpha-numeric characters onto the phosphor screen of a cathode ray tube.

Figure 2:
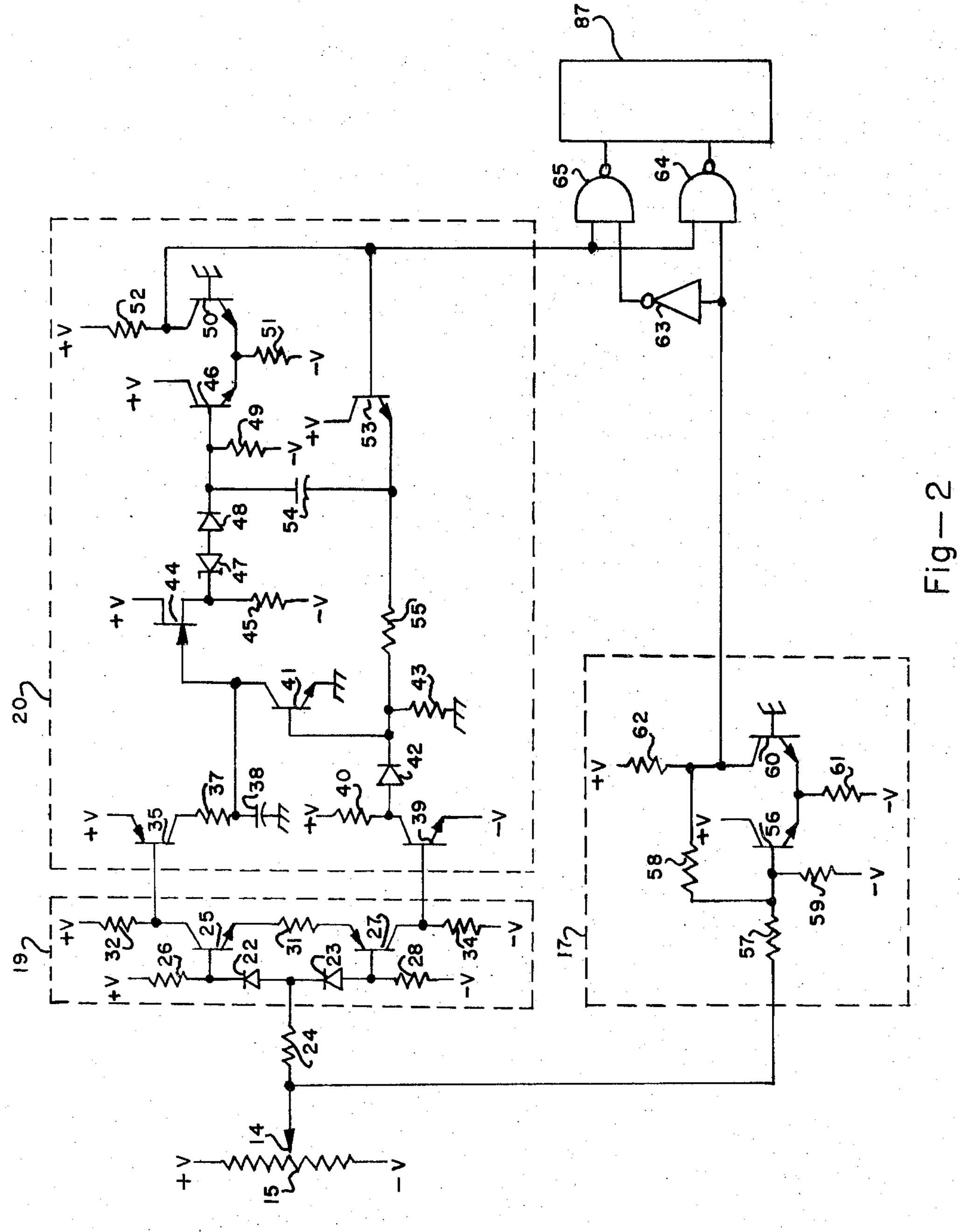
FIG. 2 is a schematic circuit diagram of the block diagram of FIG. 1.

Turning now to FIG. 2, the schematic diagram of FIG. 1, wiper arm 14 of potentiometer 15 is connected to a common connection between the anode and cathode of diodes 22 and 23 in absolute value circuit 19 through resistor 24. The cathode of diode 22 is connected to the base of NPN transistor 25 and to a positive voltage via resistor 26 while the anode of diode 23 is connected to the base of PNP transistor 27 and to a negative voltage through resistor 28. The emitters of transistors 25 and 27 are connected together via resistor 31. The collector of transistor 25 is connected to the base of transistor 35 and to a positive voltage through resistor 32 whereas the collector of transistor 27 is connected to the base of transistor 39 and to a negative voltage through resistor 34.

In the frequency converter circuit 20, the emitter of transistor 35 is connected to a positive voltage and the collector is connected to ground via series connected resistor 37 and capacitor 38. The emitter of transistor 39 is connected to a negative voltage and the collector is connected to a positive voltage through resistor 40.

The base of NPN transistor 41 is connected to the collector of transistor 39 through diode 42 and through resistor 43 to ground; its emitter is connected to ground and the collector is connected to the junction between resistor 37 and capacitor 38 and to the gate of FET 44 whose drain is connected to a positive voltage. The source of FET 44 is connected to a negative voltage through resistor 45 and to a base of NPN transistor 46 via series-connected Zener diode 47 and diode 48. This base is also connected to a negative voltage via resistor 49 and the collector is connected to a positive voltage while the emitter is connected to the emitter of NPN transistor 50; these emitters are connected via resistor 51 to a negative voltage.

The base of transistor 50 is connected to ground and the collector thereof is connected to a positive voltage through resistor 52 and to the base of NPN transistor 53 whose emitter is connected to the junction between diode 48 and resistor 49 via capacitor 54 and to the junction between diode 42 and resistor 43 via resistor 55 and whose collector is connected to a positive voltage.

Comparator circuit 17 has the base of NPN transistor 56 connected to wiper arm 14 through resistor 57 and to the junction of resistors 58 and 59; resistor 58 being connected to the collector of NPN transistor 60 and resistor 59 being connected to a negative voltage. The collector of transistor 56 is connected to a positive voltage and its emitter is connected to the emitter of transistor 60 which are both connected to a negative voltage through resistor 61. The collector of transistor 60 is connected to the junction of resistors 58 and 62 while its base is connected to ground, the other end of resistor 62 being connected to a positive voltage.

The output from polarity comparator circuit 17 is connected to the input of a conventional logic inverter circuit 63 and as an input to a conventional NAND gate 64. The output from convertor circuit 20 is connected as inputs to gates 64 and 65 and the output from invertor circuit 63 is applied as an input to gate 65. The outputs from gates 64 and 65 are applied as inputs to conventional counter circuit 18.

OPERATION OF THE INVENTION

Three modes of circuit operation will be described for full understanding of the present invention: The quiescent condition wherein knob 1 is at its center position and the circuit is held inactive, a first active condition wherein knob 1 is rotated clockwise to produce an up-count, and a second active condition wherein knob 1 is rotated counterclockwise to produce a downcount.

Discussing first the quiescent condition, the wiper arm 14 is held at the center of resistive winding 16 at which exists a null between the equal and opposite voltages at the ends of winding 16. Thus essentially zero volts is applied to absolute-value circuit 19 and polarity comparator 17. In the absolute value circuit 19, both diodes 22 and 23 are reverse biased, and transistors 25 and 27 conduct equally. Such conduction is slight, however, and thus transistor 39 is held in a low-conduction state. A base current path for transistor 41 is provided through forward-biased diode 42 and resistor 40; the base current is sufficient to hold transistor 41 in a saturated conduction state. Since a saturated transistor has a very low resistance from emitter to collector, the collector of transistor 41 is essentially grounded. This prevents capactor 38 from attaining any charge. The base of transistor 46 is held at a negative voltage whose value is determined by FET 44, diodes 47 and 48, and resistor 49. Transistors 46 and 50 form a comparator, and the base of transistor 50 is fixed at ground. In this condition, transistor 50 has the higher base potential and is thus conducting heavily while transistor 46 is off. The negative voltage produced at the collector of transistor 50 is applied to a pair of NAND gates 64 and 65, holding their outputs high and thus preventing any activity of the counter 18. The negative voltage is also applied to the base of transistor 53, whose emitter is slightly positive, holding transistor 53 reverse biased In this quiescent condition, both transistors 56 and 60 of comparator 17 have grounded bases, however with gates 64 and 65 inactive it doesn't matter which side of the comparator is conducting.

Now assuming a clockwise movement of knob 1 and thus of wiper arm 14 along resistive winding 16, a positive voltage is applied simultaneously via resistors 24 and 57 to absolute value circuit 19 and polarity comparator 17 respectively. Taking first the positive voltage at the junction of diodes 22 and 23, diode 23 remains off while diode 22 is biased into conduction. The base of transistor 25 moves positive with respect to the fixed base of transistor 27 in linear response to the voltage selected by wiper arm 14. Thus, conduction of transistors 25 and 27 is increased, resulting in an increased current flow through resistors 31, 32, and 34. The collector of transistor 27, and hence the base of transistor 39, moves positive, increasing conduction of transistor 39. The increased current through resistor 40 produces a negative voltage which reverse biases diode 42. Transistor 41, having ground potential now at both its base and emitter, turns off. Meanwhile, the collector of transistor 25, and hence the base of transistor 35, moves negative. Transistor 35 increases conduction, drawing current through capacitor 38 and resistor 37. Thus capacitor 38 charges, producing a positive-going ramp voltage at the gate of FET 44. FET 44 functions as a source follower, thus the voltage ramp on its gate is produced at its source and coupled through diodes 47 and 48 to the base of transistor 46. Diodes 47 and 48 shift the level of the voltage ramp and in no way affect the slope. When the ramp voltage at the base of ransistor 46 raises above ground, transistor 46 turns on and transistor 50 turns off. The collector of transistor 50 then quickly raises positive, turning transistors 53 and 41 on. Transistor 41 saturates, providing a quick discharge path for capacitor 38. This action pulls the gate of FET 44 to ground, consequently pulling the source of FET 44 negative. Diode 48 reverse biases and the voltage at the base of transistor 46 drops at a rate determined by resistor 49 and capacitor 54. During the time interval required for the voltage at the base of transistor 46 to drop below ground potential the collector of transistor 50 remains at a positive voltage enabling NAND gates 65 and 64. When the voltage at the base of transistor 46 drops below ground, transistor 46 turns off, transistor 50 turns on, and transistors 53 and 41 turn off, allowing capacitor 38 to charge once again. This cycle is repeated at a rate determined by the voltage at wiper arm 14 of the potentiometer 15; it can be seen that the greater the voltage, the faster capacitor 38 will charge to the comparator reference at the base of transistor 50, and the faster the cycle will be repeated. The positive voltage pulses thus produced at the collector of transistor 50 are clock pulses applied via gate 64 to the counter. When the wiper arm 14 of potentiometer 15 is moved clockwise, the positive voltage appearing at the base of transistor 56 in the polarity comparator circuit turns transistor 56 on and transistor 60 off. Thus a positive voltage is applied from the collector of transistor 60 to NAND gate 64 and to inverter circuit 63. The output of inverter 63, then, is a negative level, or logical low, disabling NAND gate 65. As counter 18 receives clock pulses from only NAND gate 64 for this mode of operation, it counts upwardly.

Now assuming a counterclockwise movement of wiper arm 14 along resistve winding 16, a negative voltage is applied simultaneously to the absolute value circuit 19 and the polarity comparator 17. In this case, diode 23 becomes forward biased and the base of transistor 27 is pulled negative with respect to the fixed base of transistor 25. The effect is to increase conduction of transistors 25 and 27 in a manner similar to that achieved by rotating the knob 1 clockwise, and thus the collectors of transistors 25 and 27 move negative and positive respectively, as described previously. The voltage-to-frequency converter circuit 20, then, operates identically as described for clockwise rotation of the knob. The negative voltage applied to polarity comparator 17 pulls the base of transistor 56 negative with respect to the base of transistor 60, increasing the conduction of transistor 60 and producing a larger voltage drop across resistor 62. Therefore a negative voltage is applied to NAND gate 64 and to inverter circuit 63. NAND gate 64 is thus disabled, while the output of inverter 63, a logical high, is applied to NAND gate 65. As counter 18 receives clock pulses from only NAND gate 65 for this mode of operation, it counts downwardly.

It will, therefore, be appreciated that the aforementioned and other desirable objects have been achieved; however, it should be noted that the particular embodiment of the invention which is shown and described herein is intended as merely illustrative and not as restrictive of the invention.

We claim:

1. Variable rate and selective direction programmable counter means including electrical-mechanical control to program said counter means for precisely operating electronic circuitry during selected time intervals, comprising:

means for selecting positive, negative, or zero voltage levels dependent upon amount of movement of said mechanical control;

means for determining the absolute values of said selected voltage levels;

means for converting said absolute values to frequency values;

means for determining the polarity of said selected voltage levels;

coincident means for receiving the output of said converting means and said polarity determining means to provide coincident signals thereof;

reversible programmable counter means for receiving the output of said coincident means to operate said programmable counter in a forward or reverse direction; and means for providing a visual display of the information stored in said programmable counter means.

2. The control means according to claim 1 wherein said means for selecting positive, negative or zero voltage levels is a substantially symmetrical-taper potentiometer, said potentiometer having at one of its end terminals a positive voltage and at the other end terminal a negative voltage of a magnitude equal to said positive voltage so that an electrical null of zero volts exists at the center of the resistive element thereof, said potentiometer also including spring means for moving a wiper arm thereof in response to a knob means for rotating said wiper arm, said spring means maintaining such electrical null and maintaining such condition when it is not desired to increment or decrement the programmable counter means.

3. The control means according to claim 1 wherein said means for determining the absolute values of the said selective voltage levels comprises a differential amplifier including an emitter-coupled pair of transistors of opposite-polarity conductivity types and a pair of serially-connected diodes between the bases of said pair of transistors, the junction of said iodes being connected to said wiper arm of said potentiometer to receive said selective voltage levels, said differential amplifier exhibiting increased conduction in response to both positive and negative voltage levels.

4. The control means according to claim 1 wherein said means for converting the absolute voltage values to frequency values thereof comprises a sawtooth generator including capacitor means whose charge rate between a pair of fixed voltage levels varies in response to changes in said absolute voltage values.

5. The control means according to claim 4 wherein said means for converting the absolute voltage values to frequency values thereof also includes a voltage comparator, said comparator producing a binary output pulse in response to each voltage sawtooth generated by said capacitor means.

6. The control means according to claim 1 wherein said means for determining the polarity of the selective voltage levels comprises a voltage comparator, said comparator producing a pair of control signals corresponding respectively to each positive and negative voltage polarities.

7. A reversible variable-rate counter circuit, comprising:

mechanical operating means connected to means for selecting positive or negative voltage levels, said selection in response to the amount of rotation of said operating means;

polarity-sensing means for producing counter-direction control signals in response to the voltage polarity selected by said operating means;

amplifier circuit means for determining the absolute values of said selected voltage levels;

voltage-to-frequency conversion means for producing a substantially digital count signal, the frequency of which is determined by the absolute value of said selected voltage level;

reversible counter means for receiving said counter-direction control signals and said count signal, said counter means incrementing or decrementing the count in response to said operating means; and display means for providing a visual display of the count information contained in said counter means.

8. The counter circuit according to claim 7 wherein said operating means includes a single knob.

9. The counter circuit according to claim 7 wherein said means for selecting positive or negative voltage levels includes a substantially symmetrical taper potentiometer means, said potentiometer means having a positive voltage applied to a first end terminal thereof and a negative voltage applied to second end terminal thereof, thereby producing an electrical null point midway between said end terminals.

10. The counter circuit according to claim 9 wherein said potentiometer means also includes spring means for moving the wiper arm thereof to said electrical null point.

11. The counter circuit according to claim 7 wherein said polarity-sensing means comprises a voltage comparator.

12. The counter circuit according to claim 7 wherein said amplifier circuit means includes an emitter-coupled pair of transistors of opposite-polarity conductivity types and a pair of steering diodes connected between the wiper arm of said potentiometer and the respective bases of said emitter-coupled pair of transistors, said steering diodes connected in forward-bias relation to the respective transistors.

13. The counter circuit according to claim 7 wherein said voltage-to-frequency conversion means includes capacitor means which charges and discharges between a pair of fixed levels at a rate determined by said absolute voltage value.

14. The counter circuit according to claim 13 wherein said voltage-to-frequency conversion means also includes voltage comparator means for producing a digital count signal and an electronic switch means for discharging said capacitor means in response to said count signal.

15. In combination, means for incrementing or decrementing a counter at a variable rate determined by the amount an operating means is rotated, comprising potentiometer means having equal and opposite-polarity voltages applied to end terminals thereof, self-centering spring means to automatically return the wiper arm of said potentiometer means to the electrical null midway between said end terminals, means for sensing voltage polarity selected by said potentiometer means and producing counter-direction control signals relative thereto, means for determining the absolute value of said selected voltage and converting said absolute voltage value to frequency representations thereof, reversible counter means responsive to said counter-direction control signals and said frequency representations, and means for providing a visual display of the content required of said counter means.

* * * * *